United States Patent [19]

Arnold

[11] 4,361,804
[45] Nov. 30, 1982

[54] ELECTRICAL TEST INSTRUMENTS

[75] Inventor: Victor F. Arnold, St. Albans, England

[73] Assignee: Marconi Instruments Limited, Chelmsford, England

[21] Appl. No.: 173,266

[22] Filed: Jul. 25, 1980

[30] Foreign Application Priority Data

Jul. 27, 1979 [GB] United Kingdom ............... 7926239

[51] Int. Cl.³ ......................................... G01R 23/14
[52] U.S. Cl. .................................................. 324/79 R
[58] Field of Search ............... 324/78 D, 78 Z, 79 R, 324/79 D; 307/295; 328/134; 325/363

[56] References Cited

U.S. PATENT DOCUMENTS

| 3,736,510 | 5/1973 | Wu | 324/79 R |
| 3,978,403 | 8/1976 | Mansfield | 324/79 R |
| 4,236,110 | 11/1980 | Shearer | 324/79 R |

*Primary Examiner*—Michael J. Tokar
*Attorney, Agent, or Firm*—Spencer & Kaye

[57] ABSTRACT

A combined frequency and modulation measuring instrument contains a frequency counter which provides a direct indication of a carrier frequency and which is used to control the frequency of a local oscillator by means of which a modulated carrier frequency is converted directly to a required intermediate frequency.

8 Claims, 1 Drawing Figure

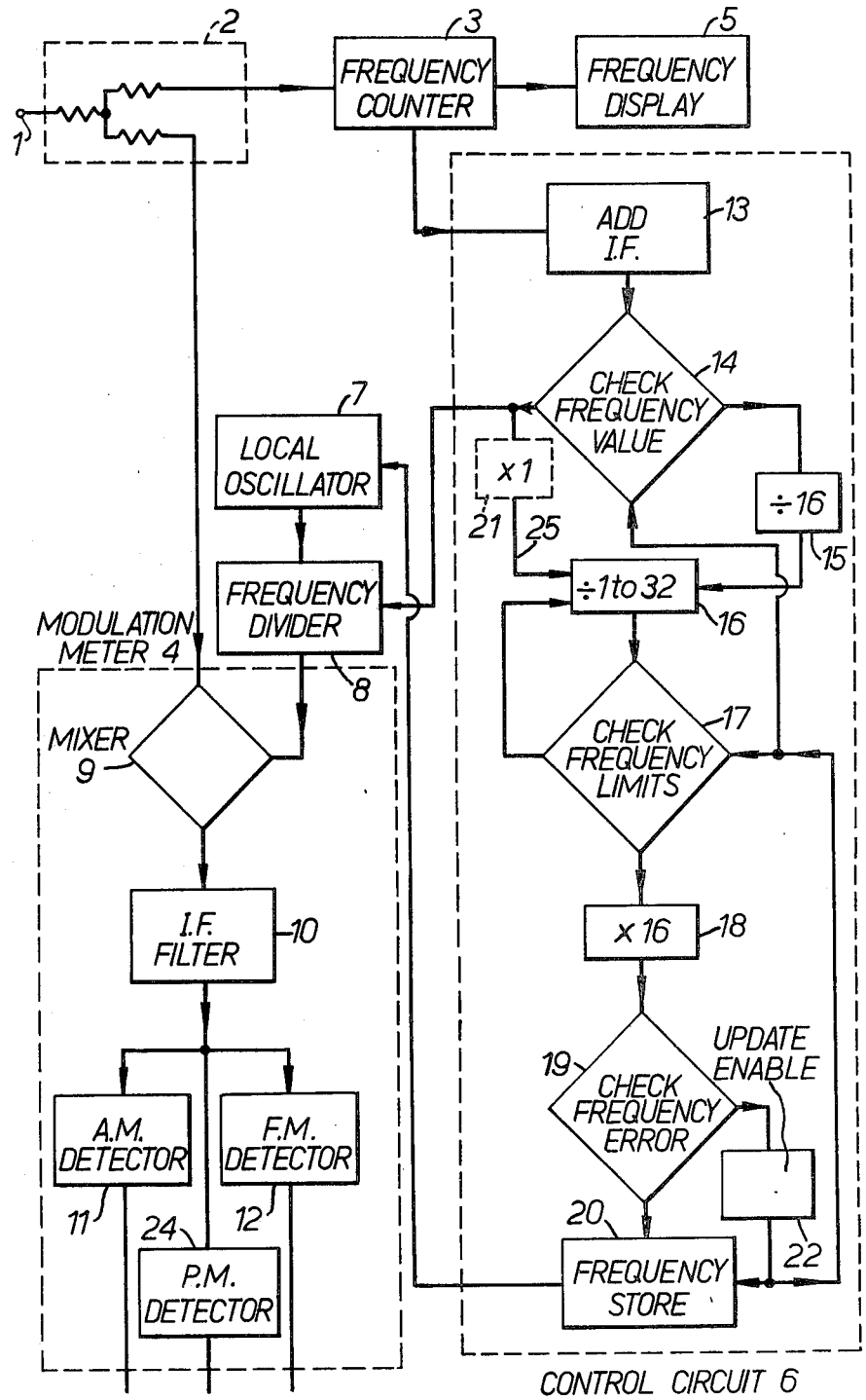

ELECTRICAL TEST INSTRUMENTS

This invention relates to electrical test instruments and is particularly applicable to instruments intended to perform measurements on modulated electrical signals. It is common in communication systems, for example, for carrier signals to carry information in the form of amplitude, frequency modulation or phase modulation and it is necessary to perform accurate measurements from time to time to ensure that the signals within such a system meet the specified requirements. Instruments for measuring amplitude modulation and frequency or phase modulation of a received carrier signal generally convert the frequency of the carrier signal to a predetermined intermediate frequency prior to measurement of the modulation itself, and hitherto it has often been achieved by means of a frequency changing mixer in a frequency lock loop which controls a local oscillator which initially has to be set to the correct-frequency by means of a frequency sweep or search system. Increasingly, however, it is becoming necessary to also provide an accurate indication of the value of the carrier frequency, and the expedient of deriving this information from a knowledge of the frequency of the local oscillator is cumbersome and inconvenient. This is particularly so when the local oscillator forms part of the automatic frequency lock loop, and the present invention seeks to provide an improved electrical test instrument.

According to this invention an electrical test instrument includes means for receiving a modulated carrier signal; a frequency counter for determining the carrier frequency; means responsive to said frequency counter for generating a signal which when combined with said received carrier signal produces a further modulated signal having a predetermined intermediate frequency; and means for measuring the modulation of said further modulated signal.

Preferably the means for generating the signal comprises a local oscillator, the output frequency of which is controlled in dependence on the count of said frequency counter.

These features avoid the need for the provision of a separate frequency sweep or search system.

Preferably a power splitter is arranged to share the power of the received modulated carrier signal between the frequency counter and a first input of a mixer circuit, a second input of which receives a signal from said local oscillator, or a signal derived therefrom, so as to produce a combined signal which constitutes said further modulated signal.

In order to remove unwanted frequency components introduced by the mixer, preferably the mixer is followed by a narrow bandpass filter tuned to said intermediate frequency.

The control of the local oscillator frequency in dependence on the count of the said frequency counter and the consequent elimination of the need for a frequency search or sweep process, enables the frequency of the local oscillator to be correctly set in a much faster time, which is highly desirable in automatic test systems.

Preferably again the mixer is a mixer arranged to mix the received modulated carrier signal with harmonics of the fundamental frequency provided by said local oscillator, or with a signal derived from said local oscillator.

To enable the electrical test instrument to perform modulation measurements on signals having widely different carrier frequencies, preferably a variable frequency divider is provided between the local oscillator and said second input of the mixer circuit, the frequency division ratio being controlled in dependence on the count of said frequency counter.

The received modulated carrier signal may be accompanied by interference, the signal may be noisy or the frequency source may be unstable. If the carrier frequency is such that the local oscillator is set ot one of its limits, any jitter on the counter output frequency information may cause the oscillator control circuits to continually switch it between different frequencies. In order to prevent this, preferably means are provided for holding constant the value of the local oscillator frequency unless a signal representative of the value of the received carrier frequency alters in excess of a predetermined amount. This amount is chosen to eliminate the effects of noise and interference and small input frequency variations.

The invention is further described by way of example with reference to the accompanying drawing, which illustrates an electrical test instrument in accordance with the present invention.

The drawing shows an electrical test instrument which is capable of providing an indication of the carrier frequency of a modulated signal applied to it, and which is also capable of providing a measurement of the amplitude modulation or frequency or phase modulation of the carrier signal. The modulated carrier signal is received at terminal 1 and is fed via a power splitter 2 to a frequency counter 3 and also to a modulation meter 4. A frequency display device 5 receives the output of the frequency counter 3 so as to provide a visual indication of the carrier frequency to an operator. The count of the frequency counter 3 is also passed to a control circuit 6, which controls the operation of a synthesised local oscillator 7 and a variable frequency divider 8 in a manner described subsequently.

The modulation meter 4 comprises a mixer 9 having a first input which receives the modulated carrier frequency from the power splitter 2, and a second input which receives a signal from the local oscillator 7 via the frequency divider 8. The frequency applied to the second input of the mixer 9 is controlled such that the output of the mixer is a modulated intermediate frequency signal of fixed and predetermined centre frequency. This signal is passed via a narrow bandpass filter 10, which is tuned to this centre frequency, and the resulting filtered signal is passed to an amplitude modulation detector 11, a phase modulation detector 24 and a frequency modulation detector 12. The detectors 11, 12 and 24 may be conventional and are arranged to provide an indication of the nature of the modulation. In the case of frequency or phase modulation, an indication of the peak frequency deviation or phase deviation is provided and in the case of the amplitude modulation, detector 11 provides an indication of the peak modulation depth.

The value of the frequency applied to the second input of the mixer 9 is controlled by the control circuit 6, which is a data processing circuit and which, in practice, may be constituted by a conventional microprocessor. However, it may instead be constituted by a dedicated control circuit arranged specifically so as to provide the functions indicated in the drawing. The control circuit 6 receives the carrier frequency from the frequency counter 3, and an adder circuit 13 adds to this the value of the intermediate frequency to which the filter 10 is tuned. This value can, of course, be stored internally within the adder 13 and a separate store is therefore not illustrated. The frequency of the resulting signal is inspected by a check circuit 14 to determine whether it lies within or above, or below the fundamental frequency range of the local oscillator 7. If it lies within or above this frequency range it is passed via a frequency divider 15 to a further variable frequency divider 16. The frequency divider 15 is a fixed divider providing a division factor of sixteen. If the frequency applied to the check circuit 14 is below the fundamental frequency range of the local oscillator, the signal is passed directly over line 25 to the variable frequency divider 16. The frequencies applied to the variable frequency divider 16 are divided successively by intergers rising from one to thirty-two until a quotient is obtained which lies within the fundamental frequency range of the local oscillator 7. This requirement quotient is detected by the check circuit 17 which halts the division process in divider 16 and the frequency value which lies within the required frequency limits is then multiplied by a factor of sixteen by a frequency multiplier 18. This frequency value is passed via a further check circuit 19 to a frequency store 20. The frequency store 20 directly controls the frequency provided by the synthesised local oscillator 7. Thus the local oscillator 7 is set to the required frequency, and its fundamental frequency or one of its harmonics will be mixed with the signal applied to the first input of the mixer 9 to give the correct intermediate frequency.

So far the function of the frequency divider 8 has not been specifically described and the above sequence of events takes place provided that the check circuit 14 finds that the frequency value applied to it lies within or above the fundamental frequency range of the local oscillator 7. In this case the frequency divider 8 provides a division factor of unity, but if this is not the case the check circuit 14 provides a control signal to the frequency divider 8 to introduce a frequency division factor of sixteen and the frequency value from the check circuit 14 is passed directly, without division, over line 25 to the divider 16. The further processes are then carried out as before. The divided fundamental frequency of the oscillator 7, or one of its harmonics will then be mixed to produce the correct intermediate frequency.

Typical frequencies, which are provided only by way of example, are as follows. The carrier frequency range extends from 1.5 to 1000 MHz and the required intermediate frequency is 256 KHz. The fundamental range of the local oscillator 7 is from 28.096 MHz to 56.192 MHz. If the carrier frequency applied to the electrical test instrument produces an input to the check circuit 14 which is within or above the fundamental frequency of the local oscillator 7, that frequency is then divided by a factor of sixteen by the fixed frequency divider 15 to give a lowest possible frequency of 1.756 MHz and a highest possible frequency of 62.516 MHz. It is this frequency which is successively divided by rising intergers within the variable frequency divider 16 until a satisfactory quotient is obtained. When a divisor value of the divider 16 is found to give the required result, the frequency value accepted by the check circuit 17 will represent a frequency in the frequency range 1.756 MHz to 3.512 MHz. This frequency value is then multiplied by a factor of sixteen by multiplier 18 to restore it to the oscillator fundamental frequency range.

However, the process described above is satisfactory only for carrier frequencies which are in or above the fundamental frequency range of the local oscillator 7. If the carrier frequency is very close to the intermediate frequency, difficulties are introduced. Firstly, the proximity of the local oscillator frequency to the intermediate frequency increases the amplitude of spurious mixer products in the intermediate frequency passband due to the signal harmonics, to the point where the performance of the instrument may be degraded. Secondly, if very high carrier frequencies have to be catered for as well by means of a single local oscillator frequency range, very high order oscillator harmonics have to be used. This has the effect of increasing frequency modulation noise since each harmonic contributes a separate band of noise. These difficulties can be largely reduced if the local oscillator 7 is operated over two frequency ranges and it is for this purpose that the frequency divider 8 is provided.

Thus, if the check circuit 14 reveals that the frequency of the signal applied to it is below the frequency range of the local oscillator 7, the division ratio of the frequency divider 8 is changed from unity to provide a division factor of sixteen, and the division process of divider 15 is omitted. Instead a unity value over line 25 is substituted.

It would, of course, alternatively be possible to omit the frequency divider 15 (and substitute a straight through path, in its place) and to omit the frequency multiplier 18, and instead to provide a frequency multiplier 21 having a multiplication factor of sixteen so that the calculation of the oscillator frequency would be carried out at the true fundamental frequency range of the oscillator instead of at 1/16th of the fundamental frequency range.

The purpose of the check circuit 19 is to continually monitor the frequency value applied to it and compare it with the value already held in the frequency store 20. When the frequency difference exceeds a predetermined value an up-date enable circuit 22 allows the new frequency value to be entered into the frequency store 20 to replace the previous value. At this point the frequency provided by the local oscillator 7 is changed by a corresponding amount under the control of the frequency store 20. The presence of the check circuit 19 prevents continous hunting of the local oscillator 7 due to noise or counter jitter, as this could adversely affect the operation of the modulation meter.

I claim:

1. An electrical test instrument including means for receiving a modulated carrier signal; a frequency counter for determining the carrier frequency; means responsive to said frequency counter for generating a signal which when combined with said received carrier signal produces a further modulated signal having a predetermined intermediate frequency; and means for measuring the modulation of said further modulated signal.

2. An instrument as claimed in claim 1 wherein the means for generating the signal comprises a local oscillator, the output frequency of which is controlled in dependence on the count of said frequency counter.

3. An instrument as claimed in claim 2 wherein a power splitter is arranged to share the power of the received modulated carrier signal between the frequency counter and a first input of a mixer circuit, a second input of which receives a signal from said local oscillator, or a signal derived therefrom, so as to produce a combined signal which constitutes said further modulated signal.

4. An instrument as claimed in claim 3 wherein the mixer is followed by a narrow bandpass filter tuned to said intermediate frequency.

5. An instrument as claimed in claim 3 or 4 wherein the mixer is a mixer arranged to mix the received modulated carrier signal with harmonics of the fundamental frequency provided by said local oscillator, or with a signal derived from said local oscillator.

6. An instrument as claimed in claim 3 or 4 wherein a variable frequency divider is provided between the local oscillator and said second input of the mixer circuit, the frequency division ratio being controlled in dependence on the count of said frequency counter.

7. An instrument as claimed in claim 2 wherein means are provided for holding constant the value of the frequency of the local oscillator unless a signal representative of the value of the received carrier frequency alters in excess of a predetermined amount.

8. An instrument as claimed in claim 5 wherein: a variable frequency divider is provided between the output of said local oscillator and said second input of said mixer circuit; and means are provided for controlling the frequency division ratio of said variable frequency divider in dependence on the count of said frequency counter.

* * * * *